United States Patent
Eschenmoser et al.

(10) Patent No.: US 12,381,108 B2
(45) Date of Patent: Aug. 5, 2025

(54) PIN LIFTING DEVICE HAVING A TEMPERATURE SENSOR

(71) Applicant: VAT Holding AG, Haag (CH)

(72) Inventors: Adrian Eschenmoser, Grabs (CH); Michael Dür, Hohenweiler (AT); Andreas Hofer, Widnau (CH)

(73) Assignee: VAT HOLDING AG, Haag (CH)

( * ) Notice: Subject to any disclaimer, the term of this patent is extended or adjusted under 35 U.S.C. 154(b) by 562 days.

(21) Appl. No.: 17/312,867

(22) PCT Filed: Dec. 10, 2019

(86) PCT No.: PCT/EP2019/084516
§ 371 (c)(1),
(2) Date: Jun. 10, 2021

(87) PCT Pub. No.: WO2020/120510
PCT Pub. Date: Jun. 18, 2020

(65) Prior Publication Data
US 2022/0020629 A1    Jan. 20, 2022

(30) Foreign Application Priority Data
Dec. 11, 2018 (DE) .......... 102018009630.1

(51) Int. Cl.
*H01L 21/687* (2006.01)
*G01K 13/00* (2021.01)

(52) U.S. Cl.
CPC ........ *H01L 21/68742* (2013.01); *G01K 13/00* (2013.01)

(58) Field of Classification Search
CPC .................... H01L 21/68742; H01L 21/67248
See application file for complete search history.

(56) References Cited

U.S. PATENT DOCUMENTS

| | | | |
|---|---|---|---|
| 5,625,526 A | | 4/1997 | Watanabe et al. |
| 5,886,864 A | * | 3/1999 | Dvorsky ........... H01L 21/68742 279/128 |
| 5,900,062 A | | 5/1999 | Loewenhardt et al. |

(Continued)

FOREIGN PATENT DOCUMENTS

| | | |
|---|---|---|
| CN | 101040059 A | 9/2007 |
| CN | 101598908 A | 12/2009 |

(Continued)

*Primary Examiner* — Kaitlin S Joerger
(74) *Attorney, Agent, or Firm* — Muncy, Geissler, Olds & Lowe, P.C.

(57) ABSTRACT

Disclosed is a pin lifting device is designed for moving and positioning a substrate to be processed in a vacuum process chamber. The pin lifting device includes a coupling part having a coupling adapted to receive a support pin designed to contact and support the substrate, and further comprises a drive part having a drive unit adapted to cooperate with the coupling such that the coupling is linearly adjustable along an adjustment axis from a lowered normal position to an extended support position and back. The pin lifting device has at least one temperature sensor, where the temperature sensor is designed and arranged such that a measurement signal representing thermal information with respect to at least part of the pin lifting device can be generated by means of the temperature sensor.

25 Claims, 2 Drawing Sheets

(56) References Cited

U.S. PATENT DOCUMENTS

Figure 1:
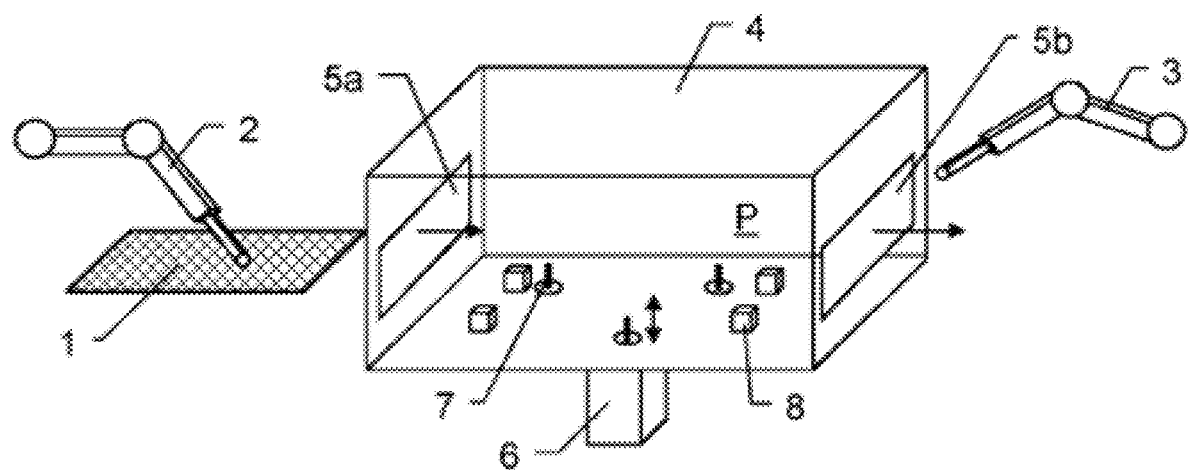

| | | | |
|---|---|---|---|
| 6,435,798 B1 | 8/2002 | Satoh | |
| 6,481,723 B1 | 11/2002 | Hao et al. | |
| 6,646,857 B2 | 11/2003 | Anderson et al. | |
| 7,244,311 B2 | 7/2007 | Fischer | |
| 10,049,905 B2 | 8/2018 | Koudai et al. | |
| 2011/0235675 A1* | 9/2011 | Matsudo | H01L 21/67248 |
| | | | 374/E11.001 |
| 2014/0269826 A1 | 9/2014 | Wu et al. | |
| 2017/0352565 A1* | 12/2017 | Zhang | C23C 16/4586 |
| 2017/0362712 A1 | 12/2017 | Yadav et al. | |
| 2018/0130696 A1 | 5/2018 | Konkola et al. | |
| 2018/0151396 A1 | 5/2018 | Deneen et al. | |
| 2020/0224790 A1* | 7/2020 | Eschenmoser | F16K 3/18 |
| 2022/0020629 A1* | 1/2022 | Eschenmoser | G01K 13/00 |
| 2022/0076987 A1* | 3/2022 | Eschenmoser | G01P 15/02 |
| 2022/0293452 A1* | 9/2022 | Sulyman | H01L 21/6833 |

FOREIGN PATENT DOCUMENTS

| | | |
|---|---|---|
| CN | 105470165 A | 4/2016 |
| CN | 110036468 A | 7/2019 |
| EP | 3361316 A1 | 8/2018 |
| JP | H09-205135 A | 8/1997 |
| JP | H1083965 A | 3/1998 |
| JP | 2004-022803 A | 1/2004 |
| JP | 2010087342 A | 4/2010 |
| JP | 2012-521652 A | 9/2012 |
| JP | 2018-093173 A | 6/2018 |
| KR | 20080053587 A | 6/2008 |
| KR | 100964619 B1 | 6/2010 |
| KR | 20150066285 A | 6/2015 |
| WO | 2010/109373 A2 | 9/2010 |

\* cited by examiner

PIN LIFTING DEVICE HAVING A TEMPERATURE SENSOR

The present application claims priority to International Application No. PCT/EP2019/084516, filed Dec. 10, 2019, and German Patent Application 10 2018 009 630.1 filed Dec. 11, 2018, each of which are herein incorporated by reference in their entirety.

The invention relates to a pin lifting device for moving and positioning a substrate in a process chamber, wherein the pin lifting device comprises a thermally sensitive sensor.

Pin lifting devices, also known as pin lifters, are typically designed and provided for receiving and defined positioning of a substrate to be processed in a process chamber. These are used in particular for vacuum chamber systems in the area of IC, semiconductor, flat panel or substrate production, which must take place in a protected atmosphere without the presence of contaminating particles.

Such vacuum chamber systems comprise in particular at least one evacuatable vacuum chamber which is provided for receiving semiconductor elements or substrates to be processed or produced and which has at least one vacuum chamber opening through which the semiconductor elements or other substrates can be guided into and out of the vacuum chamber. For example, in a production plant for semiconductor wafers or liquid crystal substrates, the highly sensitive semiconductor or liquid crystal elements pass sequentially through several process vacuum chambers in which the parts located within the process vacuum chambers are each processed by means of a processing device.

Such process chambers often have at least one transfer valve whose cross-section is adapted to the substrate and robot and through which the substrate can be introduced into the vacuum chamber and, if necessary, removed after the intended processing. Alternatively, a second transfer valve may be provided, for example, through which the processed substrate is removed from the chamber.

The guidance of the substrate, e.g. a wafer, is carried out, for example, by a suitably designed and controlled robot arm, which can be guided through the opening in the process chamber that can be provided with the transfer valve. The process chamber is then loaded by gripping the substrate with the robot arm, moving the substrate into the process chamber and depositing the substrate in the chamber in a defined manner. The process chamber is emptied accordingly.

For the placement of the substrate and for the exact positioning of the substrate in the chamber, a relatively high accuracy and mobility of the substrate must be ensured. For this purpose, pin lifting systems are used which provide a plurality of support points for the substrate and thus a load distribution (due to the dead weight of the substrate) over the entire substrate.

For example, the substrate is brought into position by the robot over the lifting pins of the lifting device and lifted by the pins. Alternatively, the pins are in a receiving position and the robot places the substrate on the pins in this position. After the robot has moved away, the substrate is deposited by lowering the pins on a carrier, e.g. a potential plate, and the robot arm, which typically carries the substrate, is moved out of the chamber, e.g. at the same time as the substrate is deposited.

The pins can be lowered further after depositing the substrate and are then present separated from it, i.e. there is no contact between the pins and the substrate. After removing the robot arm and closing (and introducing process gas or evacuating) the chamber, the processing step is carried out.

A low force effect on the substrate is particularly important after the process step has been carried out in the chamber and when the substrate is subsequently raised, as the substrate can adhere to the carrier, for example. If the substrate is pushed away from the carrier too quickly, the substrate may break, as the adhesive forces cannot be overcome or dissolved at least at certain contact points. In addition, even if contact is established between the support pins and the substrate, any impact with the substrate can lead to undesired stress (or breakage).

At the same time, in addition to the gentlest possible and careful treatment of the substrates to be processed, the shortest possible processing time should also be made possible. This means that the substrate can be brought into the defined states—loading and unloading position and processing position—in the chamber as quickly as possible.

To avoid unwanted shocks during the processing of semiconductor wafers, for example, U.S. Pat. No. 6,481,723 B1 recommends the use of a special stop device instead of hard motion stops in a pin lifter. Any hard plastic stops should be replaced here by a combination of a softer designed stop part and a hard stop, wherein the contact with the soft stop part is first made for the limitation of movement and then the hard stop is brought into contact with the soft stop part and damped accordingly.

U.S. Pat. No. 6,646,857 B2 proposes a regulation of the lifting movement by means of a recorded occurring force. The lifting pins can be moved as a function of the force signal received, so that the lifting force at the lifting pins is always applied to the wafer in a controlled and dosed manner.

With each machining cycle, the support pins are brought into contact with the substrate to be picked up and released from it. This naturally results in corresponding mechanical stresses on the pins and the drive. The machining cycles are often comparatively tight and require a relatively short process time. A large number of repetitions in a comparatively short time can be the result of this process implementation. Typically, the support pins are therefore regarded as wear material and require regular replacement, i.e. they usually have to be replaced after a certain number of cycles or a certain operating time.

Accordingly, a motor of a mechatronically designed pin lifter, i.e. a pin lifter with an electric motor for adjusting the pin, is subject to increased stress.

Naturally, a part of such a pin lifting device is connected to a process volume (process chamber), e.g. the pin lifting device is flanged to the process chamber. Typically, such a connection influences the various states of the chamber (e.g. temperature, potential) according to the state of the pin lifting device.

The above-mentioned external influences on a pin lifting device can lead to an impairment of the operation up to the failure of the device. To avoid this, the pin lifting devices are replaced at regular intervals or after a certain number of operating cycles or after a certain operating time as a precaution.

A remaining disadvantage, however, is that even if the pin lifter is replaced or serviced at regular intervals, it may deviate from its normal functionality for a certain period of time before maintenance and thus lead to faulty production cycles. Furthermore, the previous maintenance approach does not allow an optimal maintenance time to be determined, but only a regular maintenance time, which means, for example, that the pin lifter can be replaced earlier than would be technically necessary. The maintenance or renewal of such elements usually requires a standstill or interruption of production processes and a more or less massive intervention in the overall system. This often leads to comparatively long downtimes.

It is therefore the object of the present invention to provide an improved pin lifting device which reduces or avoids the above disadvantages.

In particular, it is the object of the invention to provide an improved pin lifting device which enables an optimized, i.e. in particular predictive and precise, maintenance of the device.

It is a further special object of the invention to provide a pin lifting device, which enables a monitoring of the own functionality and/or a superior process functionality.

These objects are solved by the realization of the characterizing features of the independent claims. Features which further develop the invention in an alternative or advantageous way can be found in the dependent claims.

The invention relates to a pin lifting device, in particular a pin lifter, which is designed to move and position a substrate to be processed, in particular a wafer (e.g. semiconductor wafer), in a process atmosphere region which can be provided by a vacuum process chamber. The pin lifting device comprises a coupling part having a coupling adapted to receive a support pin adapted to contact and support the substrate. In addition, a drive part is provided which comprises a drive unit which is adapted and interacts with the coupling in such a way that the coupling is linearly movable along an adjustment axis, from a lowered normal position in which the support pin in a state accommodated by the coupling is with respect to its intended effect (moving, carrying and positioning a workpiece or substrate) in an essentially ineffective state (no contact with the substrate), to an extended support position in which the support pin, in a state accommodated by the coupling, provides its intended effect of receiving and/or providing the substrate, and back again.

The intended effect of the support pin is essentially the receiving, contacting, moving, carrying and/or positioning etc. of a workpiece or substrate. In this context, an ineffective condition of the support pin is to be understood as a condition in which the pin is contactless (not yet or no longer in contact) with a substrate to be contacted as intended and in particular temporarily does not provide the intended purpose, e.g. is in a lowered waiting position. This is particularly the case while a machining process is being performed on the substrate. However, the provision of the intended effect does not exclusively mean that there is contact between the support pin and the substrate; rather, the pin can be present in this state in an extended state and can be held ready for receiving a wafer (deposit of the wafer on the pin). The processes or movements (transport of the wafer) that occur as a result of contact are also to be understood as providing the intended effect.

A non-equipped receiving state represents a state in which a support pin to be received is not in a held target position relative to the coupling (in the coupling). The equipped state is to be understood as a state in which the support pin is held by the coupling in a received target position.

The pin lifting device has at least one temperature sensor, wherein the temperature sensor is designed and arranged in such a way that a measurement signal representing thermal information relating to at least part of the pin lifting device can be generated by means of the temperature sensor.

By means of the temperature sensor, thermal effects acting on the pin lifting device can be detected. Such effects may be caused by the operation of the device itself, e.g. heat generation by the drive unit, or may be external in nature, e.g. heat transfer from a connected component or device such as the process chamber.

In one embodiment, the pin lifting device has a separating device for separating the process atmosphere region from an external atmosphere region, wherein the drive unit is at least partially, in particular completely, associated with the external atmosphere region and the coupling is in particular at least partially associated with the process atmosphere region. The separating device is designed in particular as a bellows which is arranged in the inner volume of the coupling part. The separating device of the pin lifting device can also be formed by a housing of the drive unit.

The drive unit can be designed as an electric motor, in particular a stepper motor, which provides a mechatronic pin lifting device.

The drive unit can alternatively be designed as a pneumatic drive cylinder.

In one embodiment, the drive part and/or the coupling part may have at least one temperature sensor. The thermal information can be recorded accordingly with reference to one of these components or to specific parts of the respective component.

For example, the temperature sensor may be located inside the respective part, with the sensor being provided on the inner housing wall to detect a general internal temperature or a housing temperature. Alternatively or additionally, a temperature sensor can be attached to a certain element, e.g. the coupling of the coupling part, in order to detect and/or monitor a direct temperature development on or in this element.

In particular, the drive part and/or the coupling part can have a housing and the at least one temperature sensor can be arranged on the housing (outside or inside), in particular wherein the housing is manufactured at least partially of metal, in particular of aluminum.

In one embodiment, the at least one temperature sensor can be designed as one of the temperature sensors listed below:
an NTC resistor,
a PTC resistor, in particular a platinum or silicon measuring resistor, in particular a Pt 100 element,
a semiconductor temperature sensor, in particular an integrated semiconductor temperature sensor,
an optical temperature sensor, in particular an infrared thermometer,
a thermistor and/or a
thermocouple.

In particular, the thermal information is represented by a temperature or a resistance value and/or the measurement signal is continuously detectable.

According to one embodiment, the pin lifting device can have an insulating component providing at least thermal separation between the drive part and the coupling part, in particular wherein the insulating component is arranged between the drive part and the coupling part.

The insulating component may at least partially be made of a polymeric or ceramic material, in particular polyetherketone (PEK) or polyetheretherketone (PEEK).

Such an insulating device can provide such thermal separation between two adjacent parts (coupling part and drive part) that a transfer of thermal energy between the two parts is significantly reduced or prevented.

Advantageously, potential heat input from a process chamber connected to the coupling part can be limited to the drive unit, improving control accuracy and drive unit life. It is understood that the insulating effect is bidirectional and heat transfer from the drive unit to the coupling is also avoided.

In a further embodiment, the pin lifting device can have another, i.e. at least two temperature sensors, wherein a first temperature sensor is assigned to the drive part and a second temperature sensor to the coupling part and the first temperature sensor provides a first measurement signal and the second temperature sensor a second measurement signal.

The two measurement signals of the sensors can be processed and evaluated together and/or viewed separately.

The invention also relates to a system consisting of a pin lifting device according to one of the preceding embodiments and a processing and control unit. The processing and control unit is arranged and designed to receive and/or process the measurement signal of the at least one temperature sensor, in particular the two temperature sensors, and to generate and/or output status information for the pin lifting device as a function of the measurement signal or signals.

In one embodiment, the system can have a monitoring functionality which is set up in such a way that, during its execution, the status information is continuously detected and, based on the continuously detected status information, a trend, in particular a long-term trend, for a system status and/or a change in the system status is derived, in particular wherein the thermal information is detected periodically, in particular continuously, during a specific period of time, and a temperature-time curve is derived.

The evaluation of the information provided by a temperature sensor thus makes it possible to generate additional data, which can be used to describe and record a device status and/or its development.

In particular, the status information, especially the temperature-time curve, can provide
  a reference of a current temperature to a temperature threshold value, in particular an exceeding of the temperature threshold value,
  an effect of the temperature-time curve on an operating state of the pin lifting device, in particular on process safety,
  a service life of the pin lifting device and/or
  a maintenance time to be expected for the pin lifting device.

If, for example, a significant, periodic or selective exceeding of a predefined target temperature is detected in the drive unit, this may indicate a need for early maintenance of the drive. This information can be used on the one hand to adapt the control of the pin lifting device so that it is operated with a lower load (and possibly slower) and on the other hand to output the corresponding information.

In particular, the status information can thus be derived and/or provided, in particular visually or acoustically, based on a comparison of the thermal information provided by the measurement signal with a predefined reference information, and can provide information relating to a current state or a current normal state deviation of the drive part and/or the coupling part.

In a specific embodiment, the system can have the first and second temperature sensors and the status information can be generated by processing the first measurement signal and the second measurement signal.

In the context of generating the status information, a relationship between the first measurement signal and the second measurement signal can be determined as status information (status difference) and information relating to the thermal separation between the drive part and the coupling part and/or relating to a temperature distribution in the pin lifting device can be derived from the relationship.

In particular, the status information relating to a mechanical and/or structural integrity of the drive part and/or the coupling part can be provided, in particular wherein the status information is generated by means of an actual-target comparison for the detected measurement signal.

For example, a threshold value can thus be stored for the coupling and/or the drive unit, which defines a permissible range for an operating temperature. Exceeding this threshold value indicates, for example, inadequate bearing of the moving parts and the associated generation of heat by friction. This information can thus be made accessible by measuring only the temperature of a particular part and can be output accordingly.

In one embodiment, the processing and control unit may be arranged to generate and output a control signal based on the status information, and the drive unit may be arranged and adapted to obtain the control signal and to adjust the coupling between the normal position and the support position depending on the control signal.

Such a configuration allows control and/or regulation of the pin lifter based on a currently acquired temperature information. This allows the control of the drive unit to be adjusted, in particular continuously or in real time, in such a way that thermal effects, such as linear expansion at elevated temperatures, which influence a machining process, can be compensated. Such compensation can therefore only be implemented without structural intervention in the system by adjusting the control system.

In particular, the processing and control unit can be set up in such a way that the control signal can be adjusted automatically as a function of a currently detected measurement signal, in particular wherein the currently detected measurement signal correlates with a temperature-dependent spatial extension of at least part of the pin lifting device.

Figures 2A, 2B:
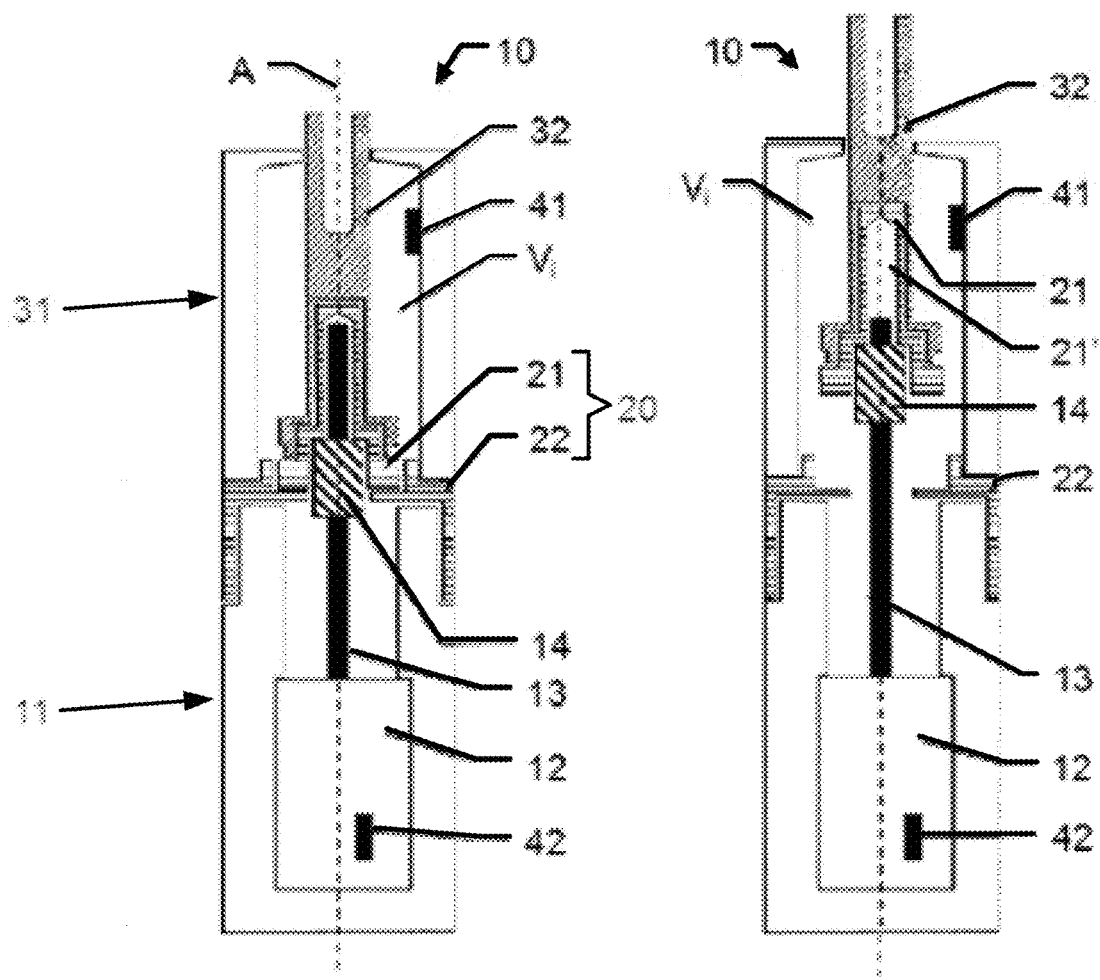
Figure 3A:
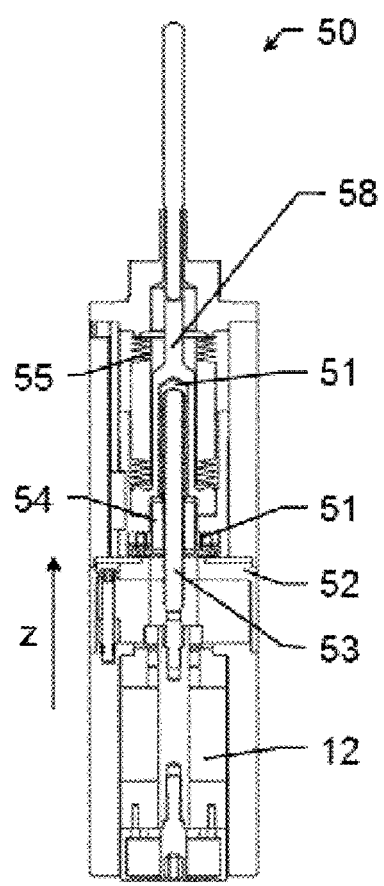
Figure 3B:
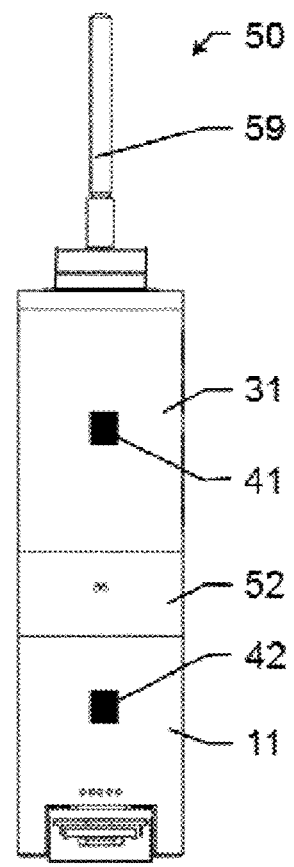

The devices according to the invention are described in more detail below by means of concrete embodiment examples schematically shown in the drawings, wherein further advantages of the invention are also discussed. The drawings show in detail:

FIG. 1 shows a schematic representation of a vacuum processing device for a wafer with a lifting device according to the invention;

FIGS. 2a-b show an embodiment of a pin lifting device according to the invention; and FIGS. 3a-b show a further embodiment of a pin lifting device according to the invention.

FIG. 1 schematically shows a process setup for processing a semiconductor wafer 1 under vacuum conditions. The wafer 1 is inserted into a vacuum chamber 4 (process atmosphere area P) by means of a first robot arm 2 through a first vacuum transfer valve 5a and brought into position by means of support pins 7 of pin lifting devices according to the invention (shown here: three pins). The wafer 1 is then picked up by the pins 7 or deposited thereon and the robot arm 2 is moved away. The wafer 1 typically rests on the robot arm or a support provided on the robot arm 2, 3 or is held by a specific support device. After wafer 1 has been picked up by pins 7, the robot arm is guided out of chamber 4, transfer valve 5a is closed and pins 7 are lowered. This is done by means of the drives 6 of the pin lifting devices which are coupled to the respective pins 7. The wafer 1 is thereby placed on the four support elements 8 shown.

In this state, a planned processing (e.g. coating) of the wafer 7 takes place under vacuum conditions and especially in a defined atmosphere (i.e. with a certain process gas and under defined pressure). Chamber 4 is coupled for this purpose to a vacuum pump and preferably to a vacuum control valve for controlling the chamber pressure (not shown).

After processing, the wafer 1 is lifted into a removal position again by means of the pin lifting devices. With the second robot arm 3, wafer 1 is removed through the second transfer valve 5b. Alternatively, the process can be designed with only one robot arm, with loading and unloading then taking place via a single transfer valve.

FIG. 2a shows an embodiment of a pin lifting device 10 according to the invention. The pin lifting device 10 has a drive unit 12 designed as an electric motor, which is assigned to a lower drive part 11 of the device 10. Motor 12 is coupled to a threaded spindle 13. The threaded rod 13 can be rotated by actuating the motor 12 accordingly.

In addition, an adjustment element 14 is provided, which in the embodiment shown is designed as a slider 14, which interacts with the threaded rod 13 and can be moved linearly along a central adjustment axis A by rotation of the rod 13. The slider 14 has an internal thread which corresponds to the thread of the threaded rod 13. In addition, the slider 14 is mounted in such a way that it cannot be rotated relative to the pin lifting device 10 itself, but can only be moved in the directions of movement parallel to the adjustment axis A. The pin lifting device 10 per se can only be moved in the directions of movement parallel to the adjustment axis A.

The slider 14 is further coupled to a first part 21 of an insulating component 20, which is movable relative to the drive unit 12. This coupling element 21 can be moved and positioned linearly by the slider. The insulating component 20 also has a second part 22, i.e. a fixing element 22, fixed to the drive part 11. Both the coupling element 21 and the fixing element 22 are manufactured in such a way that they are unable to provide electrical conductivity. In particular, the coupling element 21 and/or the fixing element 22 are made of an electrically non-conductive material, e.g. plastic (e.g. PEEK), or are coated with a non-conductive material.

The fixing element 22 is in turn firmly connected to a housing of an upper coupling part 31 of the pin lifting device. An internal volume V, of coupling part 31 is defined by the housing. Coupling part 31 has a movable coupling 32, which is designed at a first end to accommodate a support pin (not shown). In the example shown, the coupling extends essentially along axis A. The coupling 32 is connected (at its lower part opposite the first end) to the coupling element 21 of the insulating component 20. In this example, the coupling 32 has an inner recess for this purpose in which the coupling element 21 is accommodated and fixed, e.g. by means of a glued or screwed joint.

By means of the connections between slider 14, coupling element 21 and coupling 32, a controllable movement of coupling 32 and thus of a support pin accommodated in coupling 32 can be provided by motor 12. Due to the coupling element 21 of the insulating component 20, a thermal and galvanic separation is also provided between the support pin and drive 12.

FIG. 2a shows the coupling 32 of the pin lifting device 10 in a lowered normal position, in which an optionally provided support pin would be present in an essentially ineffective state with regard to its intended effect. In the case of providing the pin lifter 10 in a vacuum machining process, the support pin typically has no contact with a substrate to be processed.

FIG. 2b shows the coupling 32 of the pin lifting device 10 in an extended support position in which a coupled pin provided its intended effect of picking up, moving and/or providing the substrate.

To reach the extended support position, the motor 12 can be actuated accordingly. For this purpose, for example, a running time of the motor or a number of rotations to be carried out for the threaded rod 13 can be stored in order to set a desired position for the slider 14. In particular, an encoder is coupled to the drive unit 12 in order to make the movements of the motor axis monitorable and controllable.

The moving parts of the pin lifter 10, i.e. the slider 14, the coupling element 21 and the coupling 32, are mainly moved in the area of the coupling part 31. The slider 14 and the coupling element 21 move at least essentially within the inner volume V. The coupling element 21 in the embodiment shown is formed in a sleeve-shaped manner and provides a recess 21' defined by the shape of the element 21. This recess 21' allows a variable extension of the threaded rod 13 into the coupling element 21 and thus a translational mobility of the coupling element 21 relative to the threaded rod 13.

Firstly, the two elements 21, 22 of insulating component 20 thus provide thermal separation between drive part 11 with drive unit 12 and the housing of coupling part 31, which is arranged in a fixed position relation to it. Secondly, permanent thermal separation is also provided for the moving parts of drive part 11 and coupling part 31, i.e. between coupling 32 and slider 14.

Also an electrically conductive contact between individual components of the drive part 11 and respective components of the coupling part 31 can be prevented by means of the insulating component 20 independent of a condition of the pin lifter.

In the lowered normal position, the coupling element 21 and the fixing element 22 are preferably in contact.

The pin lifting device 10 further comprises two sensor units 41 and 42, each of which is designed to acquire thermal information. The sensor units 41 and 42 are preferably designed as temperature sensors.

The first sensor unit 41 is arranged in the inner volume V, of the coupling part 31 and thus provides the acquisition of thermal information, in particular in the form of temperature information, inside the upper part 31. The upper end of coupling part 31 can typically be connected to a process chamber, in particular flanged to it. Increased or changing temperatures of the process chamber then act directly on the coupling part 31 of the pin lifting device 10.

These thermal influences may, for example, cause an undesired change in the spatial expansion of the pin lifting device 10, in particular part of the pin lifting device 10. In concrete terms, for example, thermal expansion of the coupling 32 or the housing of coupling part 31 may occur. This also results in a change in the contact point of a support pin inserted in the coupling 32 with a workpiece to be lifted. In other words, if the coupling 32 expands thermally, the distance between the support pin and the workpiece decreases when it is lowered. During a lifting movement, the pin comes into contact with a wafer faster than in a defined thermal normal state.

For the pin lifting device 10, a correlation between a temperature in the internal volume V, and an expansion of the coupling 32 or of an intended pin, in particular with respect to the axis A, can be predetermined and deposited. By determining a current temperature using sensor 41, a current expansion state of the coupling 32 and/or connected parts can then be inferred. Such a derivation of the state can be carried out using a processing and control unit. Signals and/or information from the sensor 41 are supplied to this processing and control unit for this purpose.

The temperature sensor 41 can be arranged in an alternative (not shown) embodiment, e.g. directly on the coupling 32 or an element connected to the coupling 32.

The processing and control unit can, for example, be integrated into the pin lifting device 10 or be designed as a unit which is in communication contact with the pin lifting device 10, wherein this is in particular spatially separated from the pin lifting device 10. The processing and control unit forms such a system with the pin lifting device 10.

The status information (e.g. expansion status) can be used as a basis for generating a control signal or a control value. The control signal or control value can also be provided by the processing and control unit. The corresponding control information can then be transmitted to the drive unit 12, resulting in a correspondingly adapted control of the motor and moving the coupling 32 or the pin in a correspondingly adapted manner. This allows, for example, the thermally induced expansion or contraction in length of the coupling 32 as described above to be compensated in the process.

In an alternative embodiment, the temperature sensor 41 can be arranged on the coupling 32 or an element connecting the coupling 32 with the drive unit 12.

The second temperature sensor 42 is arranged on the drive unit 12 and thus enables the provision of temperature information with reference to the motor 12, to the threaded rod 13 or to another element of the drive part 11. This sensor 42 thus allows the derivation of status information for the drive part 11 of the pin lifting device 10.

This allows, for example, an impending overheating of the motor to be detected at an early stage and an appropriate countermeasure (e.g. switching off or slowing down the motion cycles) to be initiated.

In a specific embodiment, the information of both sensors 41, 42 can be evaluated in a combined view or processed together. Here, for example, a temperature difference between drive part 11 and coupling part 31 can be determined and derived as status information. A target range can also be defined for this difference, optionally with a specific tolerance, wherein information is output by the system when the target range is left.

With such an arrangement, the temperature difference between the two parts can be used to monitor the insulating effect of a corresponding insulating element between the parts.

It is understood that in an alternative embodiment only one of the two temperature sensors 41 or 42 is provided.

FIG. 3a shows a further embodiment of a pin lifting device 50 according to the invention. A support pin 59 is locked in a coupling 58. The support pin 59 preferably has a metallic, polymer-based or ceramic material, in particular the pin 59 is completely made of such a material. The locking device in the coupling 58 can, for example, be implemented magnetically or by means of a clamping device.

The coupling 58 can be moved in the Z-direction by means of a slider 54. The slider 54 is coupled to a threaded spindle 53 for this purpose, which in turn can be driven by the motor 12.

The insulation according to the invention between the motor 12 and the coupling 58 is realized in a first variant by a first insulating element 52, which thermally and electrically separates an upper housing part from a lower housing part, and a second insulating element, which can be embodied by the slider 54. In this variant of the pin lifting device 50, the threaded spindle 53 is designed and mounted so precisely and rigidly that no contact (electrically or thermally conductive) occurs between the spindle 53 and the coupling 58—even during a relative movement. Alternatively, the spindle 53 is made of or coated with a non-conductive or thermally insulating material. Thus a complete galvanic and thermal separation between the upper and lower part is provided in every state of the device 50.

In a second variant, both the threaded spindle 53 and the slider 54 located on the spindle 53 can be manufactured in a conductive manner (e.g. metallic). The second insulating element is designed in the form of an intermediate sleeve 51 (due to the low tolerance representation, the sleeve is referenced several times with the reference numeral 51). The intermediate sleeve 51 encloses the upper part of the threaded spindle 53 (in the lowered position shown) and thus physically and thermally separates both the spindle 53 and the slider 54 from the coupling 58.

In a third variant, both the threaded spindle 53, the slider 54 and the coupling 58 can be conductive and in direct contact with each other. This ensures conductivity from pin 59 to spindle 53. The second insulating element of the insulating component is designed as a coupling or bearing of the spindle 53 to the motor. The threaded spindle 53 is therefore thermally non-conductively connected to the motor 12 and separated from it. Through this and the separation by means of the first insulating element 52 (fixing element) a thermal separation can be provided. In the lowered position shown, the slider 54 can touch the first insulating element 52 without being in physical contact with the drive part.

The pin lifter 50 also has a bellows 55 inside the coupling part. The bellows 55 is arranged and shaped in such a way that an atmospheric separation of a process atmosphere region, in which the support pin 59 is present and a machining process usually takes place, and an external atmosphere region, in which e.g. the drive 12 and further peripheral components can be present, is provided. The bellows 55 is compressed when the pin 59 is extended, wherein the atmospheric separation is maintained.

FIG. 3b shows an exterior view of the pin lifter 50. The pin 59 protrudes from the upper side of the housing of the lifter 50. A fixing element 52 of the insulating component galvanically separates the lower drive part 11 from the upper coupling part 31 or their respective housings and translationally immovable parts.

The pin lifter 50 has two temperature sensors 41 and 42 on its outer housing side. One sensor 41 is arranged on the upper coupling part 31, the other sensor 42 on the lower drive part 11. For example, a heat transfer from a connected process chamber to the drive of the pin lifter 50 can thus be detected.

In addition to the functions described above, such an arrangement can also be used, for example, to monitor the desired insulating effect, e.g. of the insulating element 52.

It is understood that the figures shown only schematically represent possible embodiment examples. According to the invention, the different approaches can be combined with each other as well as with devices for substrate movement in vacuum process chambers, especially pin lifters, according to the prior art.

The invention claimed is:

1. A pin lifting device configured for moving and positioning a substrate in a process atmosphere region provided by a vacuum process chamber, the pin lifting device comprising:
   a support pin designed to contact and support the substrate;

a coupling part having a coupling designed to receive the support pin, and a drive part having a drive unit configured to drive the coupling linearly along an adjustment axis from:
- a lowered normal position, where the support pin is configured to provide a state substantially free of action with respect to its intended effect, to
- an extended support position in which the support pin is configured to provide for receiving and/or providing the substrate, and back, wherein the drive part or the coupling part has at least one temperature sensor, wherein the temperature sensor is designed and arranged in such a way that, by means of the temperature sensor, a measurement signal representing thermal information with reference to at least part of the pin lifting device can be generated.

2. The pin lifting device according to claim 1, wherein the at least one temperature sensor is formed as one of the following temperature sensors:
- an NTC resistor,
- a PTC resistor,
- an optical temperature sensor,
- a thermistor, or
- a thermocouple.

3. The pin lifting device according to claim 1,
wherein
the pin lifting device has an insulating component which provides at least thermal separation between the drive part and the coupling part.

4. The pin lifting device according to claim 1, wherein the pin lifting device has at least two temperature sensors, wherein
- a first temperature sensor is assigned to the drive part and a second temperature sensor is assigned to the coupling part, and
- the first temperature sensor provides a first measurement signal and the second temperature sensor provides a second measurement signal.

5. A system comprising:
a pin lifting device configured for moving and positioning a substrate in a process atmosphere region provided by a vacuum process chamber, the pin lifting device comprising:
- a coupling part having a coupling designed to receive a support pin designed to contact and support the substrate;
- a drive part having a drive unit configured to drive the coupling linearly along an adjustment axis from:
- a lowered normal position, where the support pin is configured to present in a state received by the coupling in a state substantially free of action with respect to its intended effect, to
- an extended support position in which, in particular, the carrying pin in a state received by the coupling provides its intended effect of receiving and/or providing the substrate,
- and back, wherein
  - the pin lifting device has at least one temperature sensor, wherein the temperature sensor is designed and arranged in such a way that, by means of the temperature sensor, a measurement signal representing thermal information with reference to at least part of the pin lifting device can be generated;

and a processing and control unit, wherein the processing and control unit is configured to:
- receive and/or process the measurement signal of the at least one temperature sensor, and
- generate and/or output status information for the pin lifting device as a function of the measurement signal, wherein
- the status information is derived and provided based on a comparison of the thermal information provided by the measurement signal with a predefined reference information and provides information regarding a current state or a current normal state deviation of the drive part and/or the coupling part.

6. The system according to claim 5, wherein
the system has a monitoring functionality which is set up in such a way that during its execution the status information is continuously detected and a trend for a system state and/or a change in the system state is derived on the basis of the continuously detected status information.

7. The system according to claim 5, wherein
the status information indicates:
- a reference of a current temperature to a temperature threshold value,
- an effect of the temperature-time curve on an operating state of the pin lifting device,
- a service life of the pin lifting device and/or
- a maintenance time to be expected for the pin lifting device.

8. The system according to claim 5, wherein the system comprises:
- a first temperature sensor assigned to the drive part and a second temperature sensor is assigned to the coupling part, wherein the first temperature sensor provides a first measurement signal and the second temperature sensor provides a second measurement signal; and
- wherein the status information can be generated by processing the first measurement signal and a second measurement signal.

9. The system according to claim 5, wherein
the processing and control unit is adapted to generate and output a control signal based on the status information, and
the drive unit is arranged and adapted
to receive the control signal and
to adjust the coupling between the normal position and the support position as a function of the control signal.

10. The pin lifting device according to claim 1, wherein the substrate to be processed is a wafer.

11. The pin lifting device according to claim 1, wherein the drive part and/or the coupling part has a housing and the at least one temperature sensor is arranged on the housing.

12. The pin lifting device according to claim 11, wherein the housing is formed at least partially of metal.

13. The pin lifting device according to claim 12, wherein the metal is aluminum.

14. The pin lifting device according to claim 2, wherein the thermal information is represented by a temperature and/or wherein the measurement signal is continuously detectable.

15. The pin lifting device according to claim 3, wherein the insulating component is arranged between the drive part and the coupling part.

16. System according to claim 5, wherein a long-term trend, for a system state and/or a change in the system state is derived on the basis of the continuously detected status information.

17. The system according to claim 6, wherein the thermal information is detected periodically during a specific time period, and a temperature-time curve is derived.

18. The system according to claim 6, wherein the thermal information is detected continuously, during a specific time period, and a temperature-time curve is derived.

19. The system according to claim 7, wherein the temperature-time curve, indicates:
- a reference of a current temperature to a temperature threshold value,
- an effect of the temperature-time curve on an operating state of the pin lifting device,
- a service life of the pin lifting device and/or
- a maintenance time to be expected for the pin lifting device.

20. The system according to claim 6, wherein the status information indicates:
- an exceeding of the temperature threshold value, and/or
- an effect of the temperature-time curve on process safety.

21. The system according to claim 5, wherein the status information is provided regarding a mechanical and/or structural integrity of the drive part and/or the coupling part.

22. The system according to claim 8, wherein
- a relationship between the first measurement signal and the second measurement signal is determined as status information in the context of generating the status information, and
- information with regard to:
  - the thermal separation between drive part and coupling part and/or
  - a temperature distribution in the pin lifting device can be derived based on the relationship.

23. The system according to claim 9, wherein the processing and control unit is configured to automatically set the control signal as a function of a currently detected measurement signal.

24. The system according to claim 9, wherein the currently detected measurement signal correlates with a temperature-dependent spatial extension of at least a part of the pin lifting device.

25. A pin lifting device configured for moving and positioning a substrate in a process atmosphere region provided by a vacuum process chamber, the pin lifting device comprising:
- a support pin designed to contact and support the substrate,
- a coupling part having a coupling designed to receive the support pin, and
- a drive part having a drive unit configured to drive the coupling linearly along an adjustment axis from:
  - a lowered normal position, where the support pin is configured to provide a state substantially free of action with respect to its intended effect, to
  - an extended support position in which the support pin is configured to provide for receiving and/or providing the substrate,
- and back, wherein
the pin lifting device has at least two temperature sensors, wherein the temperature sensors are designed and arranged in such a way that, by means of the temperature sensors, measurement signals representing thermal information with reference to at least part of the pin lifting device can be generated,
a first temperature sensor is assigned to the drive part and a second temperature sensor is assigned to the coupling part, and
the first temperature sensor provides a first measurement signal and the second temperature sensor provides a second measurement signal.

* * * * *